April 23, 1963 HARUKI TOMONOH ET AL 3,087,110

INDUCTOR SWITCHING CIRCUIT FOR TV TUNER

Filed July 9, 1959

United States Patent Office 3,087,110

Patented Apr. 23, 1963

3,087,110

INDUCTOR SWITCHING CIRCUIT FOR TV TUNER

Haruki Tomonoh, 184 2-chome Tamagawayoga, Setagaya-ku, Tokyo, Japan; Takeo Nagamatsu, 288 2-chome, Kosugi, Kawasaki, Japan; and Toshihiko Teshirogi, 996 Kamikodanaka, Kawasaki, Japan Filed July 9, 1959, Ser. No. 826,070
Claims priority, application Japan July 15, 1958
2 Claims. (Cl. 323—74)

In the present invention, it is intended to obtain an oscillator circuit for a TV receiver with high frequency accuracy, which is capable of selecting arbitrarily the value of inductance employed to form a number of local oscillator circuits, by successive change-over of the taps accompanying the circuit in which a number of inductors are connected.

It is very difficult to make an oscillator with high frequency in the high frequency band such as used in the TV tuner, and it is usually the practice to adjust the receiver performance as a whole by correcting alternatively the tuner and the IF amplifier of the TV set. As a consequence a device is needed for correcting the frequency error in every one of the local oscillator circuits employed in the TV tuner.

In order to attain this object, every individual inductance is made variable in the turret type tuner.

As is well known, since the turret type tuner has many contact positions, it is accompanied by the disadvantage that contact troubles take place frequently at these contact positions and the whole external size of the tuner becomes considerably large. Consequently, following the reduction of the size of TV set, reduction of the external dimensions of the tuner has been attempted and recently there has been a tendency of using a rotary type tuner with a small number of contact positions for preventing of contact troubles at the contact positions.

Figure 1:
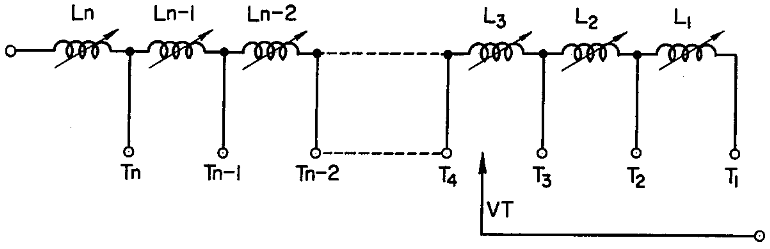
FIG. 1 is a schematic of a known tuner oscillator circuit consisting of a rotary type tuner of the type used up to this time.

In the oscillator circuit for a TV tuner of a rotary type all inductors, which are used for inductances of each channel in local oscillation L1, L2, . . . L*n* are connected in series and the switch contacts, T1, T2, . . . T*n* are led respectively from the junctions of each pair of adjacent windings, as shown in FIG. 1.

The respective inductors, L1, L2, . . . L*n* are provided with the means of enabling their magnitudes to be adjusted. Movable contact maker VT can be brought to contact selectively with all the switch contacts, T1, T2, . . . T*n*.

In this inductance connecting circuit the inductance required for composing the local oscillator circuit corresponding to each frequency may be selected as described hereunder.

That is, the value of inductance needed to generate the lowest frequency is obtained as the compound inductance of the series circuit closed via terminal A, all the inductors L1 through L*n* connected in series, switch contact T1, movable contact maker VT, and terminal B, when VT is brought to contact with T1. Similarly, when the movable contact maker VT comes into contact with the switch contact T2, the value of the 2nd lowest inductance can be obtained. Following such procedures, as the movable contact maker VT comes into contact with T3, T4, . . . T*n*–2, T*n*–1, the value for the inductance thus obtained will decrease successively, as a consequence the frequency of the local oscillator circuit including these compound inductances will go up, and when the movable contact maker VT comes into contact with the switch contact T*n*, there will be obtained the minimum value of inductance across the terminals A, B via only one inductor L*n*, switch contact T*n*, and movable tap VT, and this case gives the value for the inductance of the local oscillator circuit for the highest frequency of the tuner.

In such a tuner oscillator circuit, when an arbitrary inductance, a member of the compound inductance is varied for the purpose of adjusting the value for the inductance in each local oscillator circuit, this varied inductance, L*n* for instance, will influence the value of every compound inductance obtained by letting the movable contact maker VT come into contact with the switch contact situated on the right of the switch contact T*n* led from the position where it is connected, therefore, in case of changing over the connection of oscillating circuits it may be needed to readjust all the inductances located on the left of the switch contact which is in contact with the movable contact maker VT. Such readjustment of inductance is very disadvantageous, especially when a wide band such as in the case of a TV tuner is sought to be obtained.

According to the present invention, an advantageous connection system of oscillator circuits can be obtained which employs the rotary type tuner and yet necessitates no complicated work of adjustment such as mentioned above.

Figure 2:
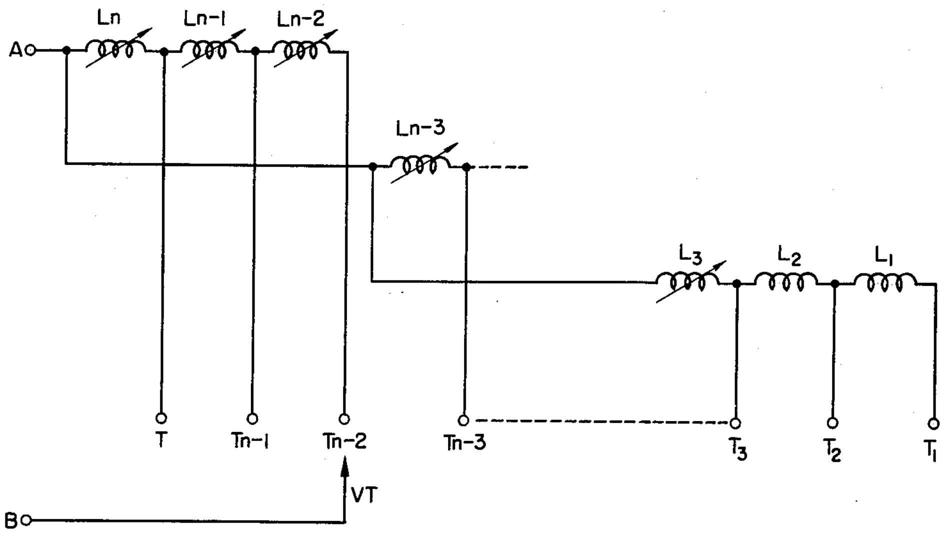
FIG. 2 is a schematic of an oscillator circuit according to the invention.

In the present invention, as shown in FIG. 2, many windings, L1, L2, . . . L*n* are divided into an arbitrary number of parallel groups, and the inductors belonging to each group, for example (L1, L2, L3), are respectively connected in series, and in this case all the switch contacts T1 . . . T*n* led from the positions where the respective windings are connected are arranged so that they may be able to come into contact with the common movable contact maker VT. Consequently, in this oscillator circuit, the value for the inductance needed for composing each oscillator circuit can be obtained as follows:

That is, the value of inductance needed for composing the local oscillator circuit corresponding to the lowest frequency to be derived from the switch contact T1 is obtained as the sum of three inductances, L1, L2, L3; the value for inductance derived from the switch contact T2 as the sum of inductances L2 and L3, and that derived from the switch contact T3 as the value for L3; similarly the one derived from the switch contact T*n* is obtained as the value for L*n* corresponding to the highest frequency.

Adjustment of the value for the inductance of each local oscillator circuit is considerably simplified by dividing many windings into an arbitrary number of groups, as has been explained above. That is, a changed value for an arbitrary inductance L*n* for example, in a group only influences the oscillating frequency of the local oscillator circuit including the inductances L*n*–1, L*n*–2 in the same group, therefore, in adjusting the oscillating frequency of each local oscillator circuit only the adjustment is needed of every individual inductance in the group in which the inductances belonging to the respective local oscillator circuit are included. (In the example mentioned above adjustment of only 3 inductances L*n*, L*n*–1, L*n*–2 will suffice.) Thus it turns out that this connection system facilitates considerably the adjustment of the value for the inductance in each local oscillator circuit in the TV tuner where the oscillator circuit with a wide band covering the frequency range 30—300 mc. is needed.

According to the present invention in which a number of inductances are divided into several groups further advantages are obtained as described hereunder.

That is, the frequency band-width of the local oscillator circuit divided into the respective group is narrowed remarkably as compared to the whole band-width of the TV tuner oscillator circuit, and consequently the practical adjustment of the values for the inductances in the local oscillator circuit belonging to each group can be carried independently without influences on oscillating frequency of each channel belonging to other groups. Therefore, it is not necessary to compose all of many inductances as adjustable inductances, instead, as shown in FIG. 2, the value for the inductance belonging to every local oscillator can be adjusted by composing only an inductance with the highest oscillating frequency in each group, for example L3 in block No. 1 in FIG. 2 as the adjustable inductances. By such means the adjustment work of the value for inductance can be simplified further, and the manufacturing cost of the tuner can be reduced simultaneously.

What we claim is:

1. In a rotary tuner wide band oscillator tuning circuit arrangement for a television receiver having a rotary tuner comprising, in combination, a first terminal and a second terminal, a plurality of inductors connected in an arbitrary number of groups, connections for each group connecting the inductors in each group in series, at least one of the inductors in each group having a variable inductance, a plurality of stationary contacts connected to respective groups of inductors and each connected individually to a respective junction between a pair of adjacent inductors of a respective group, connections for each group connecting each of said groups of inductors in common to said first terminal, a rotary tuner contact connected to said second terminal operable selectively into separate operative positions to make electrical contact individually alternatively with said stationary contacts connected between said inductors to complete a circuit between said first and second terminals only through a given group of inductors corresponding to the group to which the stationary contact contacted by said rotary contact belongs, whereby solely the inductance of a respective group of inductors is varied when the inductance of the inductor having a variable inductance in a given group is varied.

2. A wide band oscillator tuning circuit arrangement for a television receiver according to claim 1, in which each of said inductors having a variable inductance in each group is connected in a respective group to function as an inductor required for the highest oscillatory frequency in its respective group.

References Cited in the file of this patent

UNITED STATES PATENTS

| | | |
|---|---|---|
| 2,493,746 | Bowden | Jan. 10, 1950 |
| 2,758,207 | Parzen | Aug. 7, 1956 |